| United States Patent [19] | [11] Patent Number: 4,775,449 |
| Dumas et al. | [45] Date of Patent: Oct. 4, 1988 |

[54] TREATMENT OF A POLYIMIDE SURFACE TO IMPROVE THE ADHESION OF METAL DEPOSITED THEREON

[75] Inventors: William V. Dumas, Delanson; Donald F. Foust, Scotia, both of N.Y.

[73] Assignee: General Electric Company, Schenectady, N.Y.

[21] Appl. No.: 947,116

[22] Filed: Dec. 29, 1986

[51] Int. Cl.[4] .............................................. C25D 5/54
[52] U.S. Cl. .................................... 204/30; 204/32.1; 204/37.1; 204/38.4; 427/98; 427/304; 427/306; 427/307
[58] Field of Search .................. 204/30, 37.1, 38.4, 204/32.1; 427/98, 304, 306, 307

[56] References Cited

U.S. PATENT DOCUMENTS

| 3,770,528 | 11/1973 | Hermes | 156/2 |
| 3,791,848 | 2/1974 | DeAngelo | 117/47 A |
| 4,078,096 | 3/1978 | Redmond et al. | 427/98 |
| 4,517,254 | 5/1985 | Grapentin et al. | 428/626 |
| 4,576,685 | 3/1986 | Goffredo et al. | 204/30 |

FOREIGN PATENT DOCUMENTS 3328765 2/1985 Denmark .
211128 7/1984 German Democratic Rep. .

*Primary Examiner*—R. L. Andrews
*Attorney, Agent, or Firm*—Francis T. Coppa; James C. Davis, Jr.; James Magee, Jr.

[57] ABSTRACT

A method of improving the adhesion of metal applied on a polyimide surface is disclosed, in which the surface is first treated with an adhesion-promoting compound containing a nitrogen-oxygen moiety prior to plating of the metal thereon.

24 Claims, No Drawings

TREATMENT OF A POLYIMIDE SURFACE TO IMPROVE THE ADHESION OF METAL DEPOSITED THEREON

BACKGROUND OF THE INVENTION

This invention relates to a method of improving the adhesion of metal applied on the surface of a polyimide.

During the past few decades, printed circuit boards have become the predominant vehicle for mounting and interconnecting electronic components in order to manufacture a desired electronic circuit. The printed circuit board typically consists of a sheet of a dielectric, i.e., nonconductive, substrate constructed of various filled or unfilled synthetic materials such as phenolics, glass-impregnated epoxies, and the like. The substrate is provided with a pattern of thin metal foil which functions as a conductive path on one or both sides. The conductive paths, also referred to as "traces", are usually formed of a conductive material such as a metal, e.g., copper, palladium, nickel, gold, and the like. The traces collectively define all of the electrical connections between components on the board, and are routed between appropriate locations on the board.

Plastics such as polyimides and polyphenylene oxides are particularly suitable as materials for printed circuit board substrates because of their strength, heat resistance, dimensional stability, and easy moldability. However, polyimide substrates are not easily provided with a strongly adherent metal trace. The printed circuit, i.e., the plated metal conductive path, can be damaged or separated from the substrate during subsequent manufacturing steps or during use of the circuit board.

Several attempts have been made to increase the adhesion of the conductive metal traces to the polyimide substrates. Adhesion is generally measured as "peel strength", i.e., the force under controlled conditions required to peel the trace from the substrate. For example, chemical and physical surface treatment techniques are often used to physically modify the as-molded polyimide surface and thereby improve the adhesion of metal subsequently applied thereto. The polyimide surfaces can be grit-blasted to provide a roughened surface which anchors the subsequently-applied metals. Furthermore, chemical swelling agents or penetrants can be used to swell the surface, while chemical etching agents can be used to remove portions of the surface.

While such methods do increase adhesion, they are often not entirely satisfactory for several reasons. Such techniques result in degradation of the molecules forming the polyimide surface, and may decrease both the tensile and impact strength of the substrate due to swelling and cracking of the entire substrate material, especially in those instances in which the polyimide contains fillers. Grit blasting requires cumbersome equipment and impedes the processing of printed circuit boards.

The primary object of this invention is to provide a process for improving the adhesion of metal to a polyimide surface without physical modification or degradation of the surface structure.

An additional object of this invention is to provide a process for increasing the adhesion of metallic traces to a polyimide surface while maintaining the ability of the surface to be patterned by various techniques.

SUMMARY OF THE INVENTION

The foregoing objects are achieved by a process in which the polyimide surface of the substrate is treated with an adhesion-promoting compound to cause subsequently applied metal to adhere more tenaciously to the substrate. The compound is characterized by the presence of an >NO— moiety.

Preferred polyimides for the present invention are those commonly referred to as "polyetherimides", e.g., those formed by the reaction of dianhydrides of bisphenol A with various diamines. The polyimide surface may be treated with the adhesion-promoting compound by several methods, e.g., spraying or flowing a solution containing the compound onto the surface, or by immersing the surface in a solution containing the compound. The solution may comprise a non-aggressive liquid and the adhesion-promoting compound or one of its salts, as further described below. The method of the present invention results in a high level of adhesion of metal to the polyimide substrate as indicated by the degree of force necessary to separate the metal from the substrate.

DETAILED DESCRIPTION OF THE INVENTION

The substrate of the present invention may be in a variety of shapes and sizes. For example, the substrate may be a printed circuit board. The polyimide materials forming the substrate may be any of those well-known in the art, such as those described in the Kirk-Othmer Encyclopedia of Chemical Technology, Third Edition, Vol. 18. Polyimides may be produced by a variety of methods, e.g., by reacting carboxylic acid anhydrides with aromatic diamines. Especially preferred polyimides for the present invention are those commonly referred to as "polyetherimides", for example, those formed by the reaction of bisphenol A dianhydrides (BPADA) with phenylene diamine. Furthermore, the polyimides may contain therein various amounts of fillers or reinforcing agents, all of which are well-known in the art. Non-limiting examples of fillers and reinforcing agents are described in U.S. Pat. No. 4,525,508, and include talcs, mica, aluminum silicates (clay), zinc oxide, precipitated or natural calcium carbonate, glass fibers, glass spheres, carbon fibers, other metal fibers, whiskers or particles, etc., as well as mixtures thereof.

Furthermore, the process of the present invention is also useful for polyimides which contain various other additives, such as pigments, ultraviolet radiation absorbing agents, impact modifiers, plasticizers, antioxidants, stabilizers, processing aids, antistatic agents, and the like.

The adhesion-promoting compound of the present invention is characterized by the presence of a nitrogen-oxygen moiety, >NO—, in which the nitrogen atom is covalently bonded to the oxygen atom.

Illustrative compounds which include this moiety are selected from the group consisting of

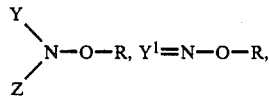

and salts or hydrates thereof;

wherein R is selected from the group consisting of hydrogen; alkyl groups having about 1 to about 10 carbon atoms; aromatic groups containing about 1 to about 20 carbon atoms; sulfonic groups; acyl groups; and amide groups;

wherein Y and Z are individually selected from the group consisting of hydrogen; alkyl groups having about 1 to about 20 carbon atoms; aromatic groups containing about 1 to about 20 carbon atoms; acyl groups; and amide groups;

or Y and Z together form at least one heterocyclic carbon-containing ring with said nitrogen;

or Z and R together form at least one heterocyclic carbon-containing ring with said moiety; and wherein $Y^1$ is selected from the group consisting of alkylidene groups having about 1 to about 20 carbon atoms and cycloalkylidene groups containing about 1 to about 20 carbon atoms.

Furthermore, the groups forming Y, Z, $Y^1$ and R may have various substituents attached thereto, such as alkyl, aromatic, alicyclic, alkenyl, halo, nitro, alkoxy, and sulfuric.

A preferred compound conforming to the

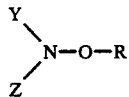

structure is hydroxylamine, a relatively inexpensive material which significantly improves the adhesion of metal to various polyimide surfaces when used in accordance with the procedures described below. Other compounds within the scope of the present invention which exemplify the

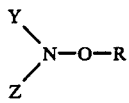

structure are N,N-dimethylhydroxylamine hydrochloride, methoxylamine hydrochloride, N-methylhydroxylamine hydrochloride, O,N-dimethylhydroxylamine hydrochloride, hydroxylamine-O-sulfonic acid, hydroxyurea, and acetohydroxamic acid. As used herein, the term "sulfonic" is meant to encompass groups containing the monovalent —$SO_2OH$ or —$SO_3H$ radicals.

Furthermore, compounds which form heterocyclic carbon-containing rings with the nitrogen of an >NO— moiety are also suitable as adhesion promoters. Illustrative of these are 1-hydroxybenzotriazole hydrate, formaldoxime trimer, and imides such as N-hydroxysuccinimide, N-hydroxyphthalimide and the like.

Oxime compounds characterized by the presence of an >NO— moiety and conforming to the $Y^1$=N—O—R structure described above are also suitable as adhesion promoters. Non-limiting examples include acetaldoxime, acetone oxime, cyclohexanone oxime, and oximes having aliphatic, aromatic, alicyclic or heterocyclic substituents attached thereto, such as 2-pyridinealdoxime and the like.

Illustrative compounds in which Z and R together form at least one heterocyclic ring with the >NO— moiety include cycloserine and the like.

Particularly preferred compounds which appear to provide excellent adhesion at treatment levels of 1M or less as described below are O,N-dimethylhydroxylamine hydrochloride, acetone oxime, 2-pyridine aldoxime, N-hydroxyphthalimide, and 1-hydroxybenzotriazole.$H_2O$.

The active ingredient of the present invention, i.e., the adhesion-promoting compounds such as those described above, may be applied to the polyimide surface by a variety of techniques. For example, if the adhesion-promoting compound is a solid, it may be dissolved in an aqueous or organic solvent and applied in the form of a solution. Furthermore, some of the adhesion-promoting compounds, for example, hydroxylamine, may be used in the form of a salt or hydrate, such as hydroxylamine sulfate or hydroxylamine hydrochloride, the latter also referred to herein as $NH_2OH.HCl$.

In one embodiment of the present invention, the adhesion-promoting compounds may be incorporated into an aqueous liquid which preferably has a pH of less than about 7.0. Suitable aqueous liquids include water and mixtures of water with various acids such as hydrochloric acid, nitric acid, sulfuric acid, and the like. As used herein, "incorporation" of the adhesion-promoting compounds implies dissolution of a solid adhesion-promoting compound in one or more solvents, or the mixing of a liquid adhesion-promoting compound with one or more other liquids, the latter also referred to herein as solvents. In preferred embodiments, the adhesion-promoting compounds are incorporated into one or more organic solvents. The organic liquids which may be used in the present invention include those organic liquids in which the adhesion-promoting compound or one of its salts or hydrates is stable and has sufficient solubility to produce an effective amount of the active ingredient in solution. The solvent must also be non-aggressive to the polyimide of which the substrate is formed. A non-aggressive solvent as defined herein is one which will not discolor, weaken, or cause other deleterious effects to the bulk of the polyimide substrate when the substrate is immersed in the solvent system for a period of up to about 60 minutes. The bulk of the substrate as used herein is the region of the substrate which is about 15 microns or greater below the surface being plated by the various embodiments of the present invention. Furthermore, an "effective amount" of adhesion-promoting compound is defined herein as an amount sufficient to improve the adhesion of a metal layer applied to the polyimide surface as measured by the testing apparatus discussed below.

Organic liquids in which the adhesion promoter may be incorporated include alcohols as defined in the *Condensed Chemical Dictionary*, Van Nostrand Reinhold Company, 10th Edition, page 27. Typical alcohols suitable herein include methanol, ethanol, phenol, cyclohexanol, and ethylene glycol, with methanol being preferred. Mixtures of alcohols with other organic compounds are also suitable. Illustrative mixtures are those of methanol and pyridine; methanol and methylene chloride; and methanol and dimethylformamide (DMF). Particularly preferred solvent mixtures comprise from about 5 to about 95 percent of dimethylformamide, the balance being methanol. For example, it is preferred that dimethylformamide comprise from about 5 to about 50 volume percent of the dimethylformamide/methanol system.

The concentration of the adhesion-promoting compound in any of the aqueous or organic solvent systems discussed above depends on the particular compound used, and typically ranges from about 0.1M to about 4M. The upper limit of the concentration is dependent on the saturation point of the compound in the solution. A particularly preferred concentration range is from about 0.5M to about 2M. Larger concentrations within the above ranges are sometimes used when faster process times to produce a particular level of adhesion are desired.

The solvent system containing the adhesion-promoting compound may be sprayed, brushed or otherwise coated onto the surface of the polyimide substrate. In preferred embodiments, the substrate is immersed in the organic or aqueous solution for a preselected period of time. The immersion time will depend on several factors, including the particular adhesion promoter used and its concentration in the solution, as well as the type of aqueous or organic solvent employed. The organic solvent systems described above appear to allow the adhesion promoter to remain in more intimate contact with the surface during immersion than when the aqueous liquid systems are utilized, and therefore may require a shorter immersion time. Typically, the treatment time ranges from about 10 minutes to about 60 minutes. As shown in Table 2 below, there may be a maximum treatment time limit for the substrate surface when certain adhesion-promoting compounds are employed, i.e., treatment periods longer than the maximum will no longer improve adhesion. For example, this maximum treatment time is typically about 10–30 minutes for polyimide substrates immersed in organic solutions containing hydroxylamine hydrochloride. However, the maximum time limit in a particular treatment will depend on the nature of the particular polyimide substrate, as well as the particular solvents and adhesion promoters used, and may be readily determined without undue experimentation by those skilled in the art.

Another factor influencing the exposure time is the presence or absence of filler materials in the polyimide. For example, inorganic filler material near or protruding from the polyimide surface may affect the adhesion of subsequently applied metal layers, and may therefore alter the time necessary for treatment with the adhesion promoter to achieve a desired level of adhesion. Those skilled in the art can readily determine the effective treatment time for a particular filled polyimide.

When the polyimide contains a filler such as those described above, a pretreatment prior to treatment with the adhesion-promoting compound may be performed to further improve the adherence of metals subsequently applied to the surface. After the surface has been cleaned by well-known methods, e.g., the use of a degreasing solution, the pretreatment comprises first treating the surface with an etching compound, e.g., a solvent which is capable of etching the polyimide. Non-limiting examples of etching compounds suitable for use on a polyimide surface include concentrated sulfuric acid, dimethylformamide, pyridine, tetrahydrofuran, and methylene chloride. Although these compounds remove a layer of the polyimide surface as described below, they are considered nonaggressive because they do not swell or crack the bulk of the polyimide substrate, as often occurs when swell and etch techniques of the prior art are employed. The etching compound may be applied by well-known methods, e.g., brushing, spraying, immersion and the like, and in preferred embodiments, is followed by rinsing with water, methanol or other alcohols.

After the etching compound has been applied, a residual film of varying thickness is present on the polyimide surface. The film remains on the surface even after rinsing. The film may be loosened from the surface by treatment with a basic solution by one of the methods described above. Suitable basic solutions include those formed by dissolving 0.1M to about 4.1M of a compound such as sodium hydroxide, potassium hydroxide, tetramethylammonium hydroxide, and mixtures thereof in a solvent such as water, methanol, ethanol, and mixtures thereof. Those skilled in the art will be able to select a particular solvent, solute, and solute concentration without undue experimentation.

After treatment with the basic solution and rinsing of the surface again, the loosened residue may be removed by treatment with a solution comprising an alcohol as defined above and one of the etching solvents described above, with the proviso that the etching solvent be one which would not react with the alcohol. For example, sulfuric acid reacts with methanol and thus would not be suitable for use in this step. Methanol is the preferred alcohol because of its ability to quickly remove the loosened residue. The solution ingredients and their respective proportions depend in part on the particular polyimide employed and on the amount of residual film present on the polyimide surface, and may be readily determined by those skilled in the art. Typically, the volume ratio of alcohol to etching solvent ranges from about 20:80 to about 80:20, with 50:50 being preferred. Furthermore, treatment of the polyimide with the adhesion-promoting compound discussed above may be combined with this pretreatment step by incorporating the adhesion promoter into the solution comprising the alcohol and the etching solvent.

Although the specific mechanism is not completely understood, it is thought that the pretreatment further enhances adhesion of filled polyimides by removing impurities from the surface and by removing a surface layer, i.e., the residual film, which contains only polyimide, to expose an underlying surface containing both polyimide and filler. The effect of the etching compound and the presence of intermittent protrusions of filler material on the newly exposed surface apparently allows the subsequently applied metal to become anchored securely to the "roughened" surface.

The pretreatment of the polyimide surface may also be performed when the polyimide does not contain a filler, but is especially beneficial for enhancing adhesion in those instances in which the polyimide surface does contain a filler.

The solution containing the adhesion-promoting compound may be prepared shortly before treatment of the polyimide surface. Alternatively, the solution may be prepared up to about several months prior to use in the present invention. The temperature of the solution during immersion of the substrate may range from about 15° C. to about 30° C., although a specific temperature for the solution is not deemed to be critical to the method of the present invention.

The specific chemical mechanism by which the adhesion-promoting compound enhances adhesion of metal subsequently applied to a polyimide substrate is not fully understood. Although the applicant does not wish to be bound by a theory regarding his discovery of treatment with these adhesion promoters, it is thought that when a polyimide substrate is treated, the >N—O— moiety of the adhesion-promoting. compound acts as a reducing agent and is also incorporated into the polyimide either along the diamine-based chain portion or onto the dianhydride-based portion of the polyimide. Thus, treatment of the polyimide with the adhesion promoter may involve some chemical alteration of the polyimide. However, such treatment does not degrade or weaken the bulk of the substrate, unlike swell and etch treatments of the prior art.

After treatment of the polyimide surface by exposure to the adhesion-promoting compound, the substrate may be thoroughly rinsed with distilled water or a methanol solution and then activated for plating by methods well-known in the art and described, for example, in U.S. Pat. 3,589,916. For example, the substrate may be contacted with an acid solution of a precious metal, such as palladium chloride in hydrochloric acid, for a period of time sufficient to cause catalytic activation of the substrate. Typical activation and plating processes suitable for the present invention are described in the application of W. T. Grubb et al., Ser. No. 944,728, filed Dec. 22, 1986, assigned to the assignee of the present invention, and incorporated by reference herein.

After the polyimide surface has been catalytically activated, a thin metal layer is applied to the surface by immersion of the substrate in an electroless plating bath. Non-limiting examples of metals suitable for use in the present invention include copper, palladium, nickel, and gold. Electroless baths are well-known in the art and are generally described in the Kirk-Othmer Encyclopedia of Chemical Technology, Third Edition, Vol. 8. The selection of a particular bath or electroless plating process is not critical to the present invention. The contents of the bath and the particular plating parameters, e.g., temperature, pH, and immersion time, will of course depend on the particular polyimide serving as the substrate and also upon the particular metal being deposited thereon. For example, when copper is being electrolessly plated onto a BPADA/phenylene diamine-based polyimide, a plating bath with the following contents is typically used 0.04M copper sulfate; 0.05M copper complexing agent; 0.08M formaldehyde; 0.1M sodium hydroxide; and 1.0 ppm of a sulfur stabilizer. Exemplary of this type of copper bath is the "Metex 9042" bath sold commercially by the MacDermid Corporation. Immersion in such a bath for a period of time of from about 3 minutes to about 10 minutes at a bath temperature of about 23° C. will result in an electroless-deposited metal layer having a thickness in the range of about 0.01 mil to about 0.06 mil.

In certain embodiments of the present invention, the polyimide surface having the electrolessly-plated metal layer thereon may be heat treated prior to the electroplating of a second metal layer. Oven heating of the entire article, i.e., substrate with metal thereon, serves to heat-treat the polyimide surface. Furthermore, any heating method is suitable. Typically, this heat treatment is carried out at a temperature ranging from about 60° C. to about 170° C. for about 5 minutes to about 120 minutes, with higher temperatures within the above range compensating for shorter duration.

Although the exact chemical mechanism is not understood, the heat treatment appears to enable the adhesion of the metal to the polyimide to increase quickly. When the adhesion-promoting process is used without this heat treatment, the same level of adhesion can be achieved, but in a longer period of time, i.e., if the polyimide surface is allowed to sit for a period of time after final electroplating.

After the first layer of metal has been applied to the substrate, the substrate is rinsed, cleaned and dried prior to immersion in an electroplating bath for the application of a second metal layer. Such baths are well-known in the art and are described, for example, in U.S. Pat. No. 4,555,315, incorporated herein by reference, although the particular electroplating bath used is not critical to the present invention. Furthermore, those skilled in the art appreciate that the particular bath contents will depend upon the same factors considered for the electroless deposition of metal described above. Typically, the electroplating bath is operated at a temperature ranging from about 16° C. to about 38° C., with a cathode current density in the range of about 1 ASF to about 80 ASF. A non-limiting description of such baths is given in the Kirk-Othmer reference described above in Vol. 8, beginning on page 826. When such a bath is used to apply a layer of copper to the electroless-applied layer, it typically includes an aqueous acidic copper electrolyte such as those of the acidic copper sulfate or acidic copper fluoroborate type; halide ions, such as chloride and/or bromide ions; and various other components well-known in the art. The thickness of this second metal layer will of course depend upon the particular end use of the metal-coated substrate. Typically, thicknesses range from about 1 mil to about 5 mils. A variation in thickness within this range does not appear to affect the adhesive strength of the metal to the underlying electroless layer and to the substrate.

After the second metal layer has been applied to the first layer of metal on the substrate, the composite article can be heat-treated for about 12 to about 20 hours at a temperature of from about 60° C. to about 170° C. in order to eliminate the interface between the two metal layers. An especially preferred temperature range is from about 80° C. to about 120° C. As in the case of the earlier heat treatment, this heat treatment also results in the achievement of a higher adhesion level more quickly; i.e., the same high adhesion level could be attained without the heat treatment, but over a longer period of time after final plating.

When it is desired that the metal applied to a polyimide substrate be in the form of a pattern rather than a continuous layer, the substrate surface, having been pretreated with the adhesion-promoting compound, may then be patterned by well-known methods, as described, for example, in U.S. Pat. No. 3,562,005, issued to DeAngelo et al., and incorporated herein by reference. Another patterning technique, suitable for use herein is disclosed in copending application Ser. No. 944,728, discussed above. This resistless technique involves the photopatterning of an organic substrate by first exposing the substrate to electromagnetic radiation, followed by treatment with a precious metal compound to activate the surface. The metallic pathway formed after plating of the activated surface will tightly adhere to the underlying polyimide substrate because of the adhesion-promoting treatment of the present invention.

In those instances in which even greater adhesive strength between the metal pattern and the underlying polyimide substrate is desired, the substrate may be abraded prior to treatment with the adhesion promoting compound. Well-known abrasion methods, e.g., grit blasting, are suitable for the method of the present invention. The combined effects from abrading the substrate and then treating the substrate with the adhesion-promoting compound often results in even greater adhesive strength than when the abrasion step is omitted.

Furthermore, the abrading step may also be used in conjunction with the pretreatment step described above. However, since the abrasion step may alter the appearance of certain polyimides, its effect on the physical appearance of the particular polyimide employed should be determined beforehand.

The following specific examples provide novel embodiments of the present invention. They are intended for illustrative purposes only and should not be construed as a limitation upon the broadest aspects of the invention. All liquid ratios are by volume, unless otherwise indicated.

In these examples, adhesion of the metal to the substrate was evaluated by measuring the force necessary to peel strips of the metal from the substrate surface. In the test, the copper surface of each plated sample is etched into ⅛ inch strips. An end of each strip is clipped to an Ametek digital force measuring gauge which is connected to a computer processor. Force values required to lift the metal strips from the substrate are converted by the computer into pounds per inch peel values. Multiple peel values for each strip are obtained and then averaged.

EXAMPLE 1

Samples 1-17 were substrates formed from a polyimide material having 30% by weight milled glass dispersed therein. Each sample was immersed in 1,1,2-trichlorotrifluoroethane for about 2 minutes to remove dirt, grease and other contaminating substances, and then dried. The samples were then subjected to a pretreatment process by immersion for about 3 minutes in a concentrated sulfuric acid solution, followed by a water rinse which was in turn followed by a methanol rinse. A white residual film was apparent on the surface of each sample.

The pretreatment process was continued by immersing each sample in a 2M solution of potassium hydroxide (KOH) in methanol to loosen the residual white film, after which the sample was again rinsed in the methanol solution.

Each sample was then immersed in a solution prepared by mixing or dissolving the particular adhesion-promoting compound of the present invention indicated in Table I in a 50/50 solution of methanol/DMF for 20 minutes. A 1M concentration of the adhesion-promoting compound was used for Samples 1-17, with the exception of Samples 7, 10 and 15. The adhesion-promoting compounds corresponding to those three samples were not completely soluble in the solution and therefore, less than 1M was incorporated therein, i.e., an amount up to the saturation point of the solution. This immersion was followed by successive two minute rinses in methanol, in a 1M solution of KOH in methanol, and in methanol again. These three rinses are optional and were used herein because they enhance patterning of the surface if such a technique is later employed. They neither improve nor detract from the adhesion levels obtained by the present method. A single rinse could be used in place of these steps. Each sample was then dried. The control of Table I was a polyimide substrate of the same material as Samples 1-17, and was subjected to the same pretreatment as those samples. This sample was then immersed in a 50/50 methanol/DMF solution which did not contain an adhesion-promoting compound. The sample was then rinsed and dried in the manner of Samples 1-17.

Samples 18-21 were substrates identical to those of Samples 1-17. Each sample was pretreated as described above and then immersed in a solution to which 1.0 mole of a nitrogen-containing compound (see Table I) outside the scope of the present invention was mixed or dissolved. These samples were then rinsed and dried as described above.

All of the samples and the control were then prepared for plating by immersion in a solution of Shipley Cataprep® 404, a product of the Shipley Company. This solution provides a protecting agent for the plating catalyst subsequently applied, and comprises sodium bisulfate and various surfactants.

The samples and control were then immersed for 3 minutes in a 6% solution of Shipley Cataposit® 44, which contains the ingredients of Cataprep® 404, tin, and also palladium, the electroless plating catalyst. After a water rinse, the samples and control were immersed in a solution of Shipley Cuposit® Accelerator 19, a fluoroboric acid-containing formulation used to separate tin from the plating catalyst. After another water rinse, the samples and control were plated in an Enthone 406 electroless copper plating bath for about 6 minutes to achieve a thickness of about 0.01 mil. After again being rinsed in water, each substrate was dried and heated for 10 minutes at about 110° C.

The samples and control were then electroplated at 35 ASF with copper to achieve a total copper thickness of about 1 mil. Each sample was then heated for about 16 hours at 110° C. After being cooled, the samples were tested for adhesion by the method described above. The results are shown in Table I.

TABLE I

Treatment of Polyimides with Adhesion-Promoting Compounds

| Sample No. | Adhesion-Promoting Compound | Adhesion Value Average (lbs/in) |
|---|---|---|
| Control | None | 7.0 |
| 1 | Hydroxylamine.HCl | 8.5 |
| 2 | N,N—dimethylhydroxylamine.HCl | 8.7 |
| 3 | Methoxylamine.HCl | 8.8 |
| 4 | N—methylhydroxylamine.HCl | 9.6 |
| 5 | O,N—dimethylhydroxylamine.HCl | 11.5 |
| 6 | Hydroxylamine-O—sulfonic acid | 8.2 |
| 7 | Formaldoxime trimer | 9.8 |
| 8 | Acetaldoxime | 7.7 |
| 9 | Acetone oxime | 11.4 |
| 10 | Cyclohexanone oxime | 8.9 |
| 11 | 2-pyridinealdoxime | 11.0 |
| 12 | N—hydroxysuccinimide | 8.5 |
| 13 | N—hydroxyphthalimide | 10.8 |
| 14 | 1-hydroxybenzotriazole.H$_2$O | 10.7 |
| 15 | Cycloserine | 10.4 |
| 16 | Hydroxyurea | 7.2 |
| 17 | Acetohydroxamic acid | 8.6 |
| 18 | Trimethylamine.HCl | 6.7 |
| 19 | Ethylamine.HCl | 6.0 |
| 20 | Pyridine-N—oxide | 5.4 |
| 21 | Trimethylamine-N—oxide.2H$_2$O | 6.7 |

Table 1 demonstrates that treatment of a polyimide substrate with the adhesion-promoting compounds of the present invention results in improved adhesion of metal subsequently plated to the substrate. Samples 18-21 were treated with compounds outside the scope of the present invention and resulted in adhesion values lower than those for the control. It is thought that these compounds exhibit an oxidizing effect which tends to nullify any adhesion-promoting tendencies they might have. In contrast, it is thought that the adhesion-promoting compounds of the present invention exhibit a reducing agent effect which enhances adhesion.

Those skilled in the art appreciate that the concentration of a particular adhesion-promoting compound may be varied within the limits described above to increase adhesion values. Such adjustments depend on the particular chemical characteristics of the adhesion promoter and can be determined without undue experimentation.

EXAMPLE 2

Samples 22-25 were substrates formed from a polyimide material having 20% by weight mica dispersed therein. Samples 23, 24 and 25 were immersed in a solution prepared by dissolving 2.5M $NH_2OH\cdot HCl$ in a 50/50 by volume pyridine/methanol solution. The solutions were maintained at a temperature of about 18° C. to 20° C., and the immersion times are indicated in Table II. Sample 22, a control, was not treated in the $NH_2OH\cdot HCl$ solution.

All of the substrate surfaces were then activated with a palladium complex. A thin copper layer was then electrolessly plated on the surface in an Enthone copper bath. The substrates were then rinsed and plated in an acid sulfate electroplating bath at 35 ASF. Each sample was then heat-treated for about 16 hours at about 100° C. Peel values for each sample were obtained by the process described above. The results are shown in Table II.

TABLE II

The Effect of Hydroxylamine Treatment Time on Adhesion Values

| Sample No. | Treatment Time (minutes) | Adhesion Value Average (lbs/in) | Adhesion Value Range (lbs/in) |
|---|---|---|---|
| 22 (Control) | — | less than 2.0 | 0–3.0 |
| 23 | 10 | 3.5 | 1.8–5.0 |
| 24 | 30 | 6.0 | 5.4–6.6 |
| 25 | 60 | 2.5 | 1.6–2.9 |

Table II demonstrates that treatment with hydroxylamine results in greatly improved adhesion between the metal and the polyimide substrate. For example, adhesion values of 6 are acceptable for many current commercial uses, e.g., for the application of a copper circuit pattern onto a plastic substrate for printed circuit boards. Thus, the adhesion values obtained by the method of the present invention are very desirable for many applications in which a very strong bond between the metal and the polyimide substrate is required. The adhesion values of Table II for Samples 23, 24 and 25 would further increase and would have a much narrower range if the samples had been subjected to the pretreatment procedure described above.

Table II further demonstrates that there is a maximum treatment time for achieving excellent adhesion with $NH_2OH\cdot HCl$, as utilized in this example; and further treatment may decrease the adhesion. A maximum treatment time may not be present for all adhesion-promoting compounds of the present invention, and it is in part dependent on factors such as polyimide type, solvents, and adhesion-promoter solubility and concentration, as discussed above.

EXAMPLE 3

Samples 26, 27 and 28 were substrates formed from an unfilled polyimide material. Sample 26, a control, was not treated in a solution of an adhesion-promoting compound. Sample 27 was immersed for 30 minutes in an aqueous solution prepared by dissolving 1M $NH_2OH\cdot HCl$ in a 1M NaOH/water solution. Sample 28 was immersed for 30 minutes in an organic solution prepared by dissolving 1M $NH_2OH\cdot HCl$ in a 50/50 volume solution of pyridine/methanol. Each solution was maintained at a temperature of about 18° C.-20° C.

All three samples were then activated and plated in the manner of Example 2. Peel values for each sample were obtained by the process described above. The results are shown in Table III.

TABLE III

Treatment of Polyimides With Hydroxylamine Dissolved in Different Solvent Systems

| Sample No. | Type of Treatment | Adhesion value Average (lbs/in) | Adhesion Value Range (lbs/in) |
|---|---|---|---|
| 26 | None | less than 2.0 | 0–3.0 |
| 27 | Hydroxylamine in NaOH/Water solution | 6.8 | 5.4–8.9 |
| 28 | Hydroxylamine in 50/50 pyridine/methanol solution | 8.8 | 6.5–9.7 |

Table III demonstrates improved adhesion of metal when treatment with hydroxylamine is undertaken. Furthermore, the use of the organic solvent solution for Sample 28 resulted in better adhesion than when the aqueous solution for Sample 27 was used.

EXAMPLE 4

Samples 29-32 were polyimide substrates which did not contain any filler. Each sample was abraded by grit blasting and then rinsed in water. Sample 29 was a control and was not treated with an adhesion-promoting compound but was otherwise subjected to the following sequence of procedures, which begin with a step designated as H. Samples 30-32 were each treated with 1.0 mole of the adhesion promoter indicated in Table IV and were also processed according to the following sequence.

| Step | Procedure[a] | Time (minutes) |
|---|---|---|
| H | 50/50 methanol/DMF solution which contained adhesion promoter | 20 |
| I | Methanol[b] | 2 |
| J | 2 M KOH in methanol[b] | 2 |
| K | Methanol[b] | 2 |
| L | Dry the substrate | |
| M | Shipley Cataprep ® 404 solution | 1 |
| N | 6% Shipley Cataposit ® 44 solution | 3 |
| O | Water rinse | 2 |
| P | Shipley Cuposit ® Accelerator 19 solution | 3 |
| Q | Water rinse | 2 |
| R | Enthone 406 electroless copper plating bath | 6 |
| S | Water rinse | 2 |
| T | Dry the substrate | |
| U | Heat treatment at 110° C. | 10 |
| V | Plating in copper electroplating bath at 35 ASF to 1.0 mil total copper thickness | |
| W | Heat treatment at 110° C. | 16 hrs (approximate) |

[a]Substrates were immersed in the listed solutions, unless otherwise indicated.
[b]These steps are optional as explained in Example 1, i.e., they are pre-patterning steps.

After step W, each sample was cooled to ambient temperature and then tested for adhesion according to the above-described test. At least fifty force value data points were obtained for each sample and then averaged.

TABLE IV

Treatment of Unfilled Polyimides with Adhesion-Promoting Compounds

| Sample No. | Adhesion-Promoting Compound | Adhesion value average (lbs/in) |
|---|---|---|
| 29 (Control) | None | 1.1 |
| 30 | Hydroxylamine Hydrochloride | 6.6 |
| 31 | Acetone oxime | 3.5 |
| 32 | O,N—dimethylhydroxylamine | 6.4 |

The above results demonstrate that treatment of unfilled polyimides with the adhesion-promoting compounds of the present invention improves adhesion.

In Examples 5–12, the following sequence of steps was used to pretreat, treat, and then plate various polyimide surfaces according to the procedures described above. Variations in these steps are noted accordingly. 1M $NH_2OH \cdot HCl$ was utilized as the adhesion-promoting compound, unless otherwise indicated. The polyimide substrates were all filled with 30% by weight milled glass unless otherwise indicated. The rinses and various other liquid treatments listed below were performed by immersion of the substrate in the liquids for the indicated times. The characteristic white film which appeared on the polyimide surface after step C was removed by step H, unless otherwise indicated.

After plating, each sample was tested for adhesion as described above. At least 50 force value data points were obtained and then averaged for each sample.

Sequence and Procedures for Examples 5–12

| Step | Procedure | Time (minutes) |
|---|---|---|
| A | 1,1,2-trichlorotrifluoroethane | 2 |
| B | Dry the substrate | |
| C | $H_2SO_4$ solution (98% in $H_2O$) | 3 |
| D | Water rinse | 2 |
| E | Methanol rinse | 1 |
| F | 2 M KOH in Methanol solution | 5 |
| G | Methanol rinse | 2 |
| H | 50/50 methanol/DMF solution containing adhesion-promoting compound | 20 |
| I | Methanol rinse[a] | 2 |
| J | 2 M KOH in Methanol solution[a] | 2 |
| K | Methanol rinse[a] | 2 |
| L | Dry the substrate | |
| M | Shipley Cataprep ® 404 solution | 1 |
| N | 6% Shipley Cataposit ® 44 | 3 |
| O | Water rinse | 2 |
| P | Shipley Cuposit ® Accelerator 19 solution | 3 |
| Q | Water rinse | 2 |
| R | Enthone 406 electroless copper plating bath | 6 |
| S | Water rinse | 2 |
| T | Dry the substrate | |
| U | Heat treatment at 110° C. | 10 |
| V | Electroplate with copper in bath at 35 ASF to 1.0 mil total thickness | |
| W | Heat treatment at 110° C. | 16 hours (approximate) |

[a]These steps are optional as explained in Example 1, i.e., they are pre-patterning steps.

EXAMPLE 5

Sample 33 was a polyimide substrate which did not contain any filler. Sample 34 was a polyimide substrate containing 20% of glass fibers dispersed therein, Sample 35 was a polyimide substrate containing 30% of milled glass dispersed therein. The sequence listed above was followed for each sample, except tha 1M KOH was used in steps F and J, rather than 2M. Furthermore, pyridine was used in place of DMF in step H. The results for each sample are listed below in Table V.

TABLE V

Comparison of Filled and Unfilled Substrates Treated With Adhesion-Promoting Compounds

| Sample No. | Filler Present | Adhesion Value Average (lbs/in) |
|---|---|---|
| 33 | None | 4.0 |
| 34 | 20% glass fibers | 8.0 |
| 35 | 20% milled glass | 8.0 |

The adhesion values for Sample 33 varied widely in contrast to those for Samples 34 and 35. It is apparent that the pretreatment process of the present invention sometimes results in a proportionately greater improvement in adhesion for polyimide substrates which contain a filler as compared to polyimide substrates which do not contain a filler. This may be due to the fact that the pretreatment roughens the surface of the filled polyimides as described above, thereby leaving anchor sites for the metal subsequently applied.

It should also be noted that the adhesion value for Sample 33 is larger than the adhesion value that would be obtained if no adhesion-promoting compound had been used.

EXAMPLE 6

The above-listed sequence was used in this example, except that the concentration of the etching solvent $H_2SO_4$ in step C was varied as shown in Table VI.

TABLE VI

Variation of $H_2SO_4$ Level

| Sample No. | % $H_2SO_4$ | Adhesion value Average (lbs/in) |
|---|---|---|
| 36 | 98 | 5.9 |
| 37 | 97 | 7.8 |
| 38 | 92 | 8.0 |
| 39 | 88 | 5.4 |

The above results indicate that the level of $H_2SO_4$ may affect adhesion. For example, an $H_2SO_4$ level of 88% may not be high enough to remove a surface layer of the polyimide and thereby roughen the surface to produce the anchoring effect described above. However, all of the adhesion values in Table VI are superior to the adhesion value obtained if an adhesion-promoting compound of the present invention had not been employed.

EXAMPLE 7

The procedural sequence listed above was also followed in this example, except that the immersion time for step C was varied as shown in Table VII, and 1M KOH was employed in steps F and J.

TABLE VII

Variation of Immersion Time in $H_2SO_4$ Solution

| Sample No. | Immersion time (Step C) (Minutes) | Adhesion Value Average (lbs/in) |
|---|---|---|
| 40 | 0 | 2.0 |
| 41 | 1 | 8.0 |
| 42 | 3 | 7.7 |

TABLE VII-continued

Variation of Immersion Time in H$_2$SO$_4$ Solution

| Sample No. | Immersion time (Step C) (Minutes) | Adhesion Value Average (lbs/in) |
|---|---|---|
| 43 | 5 | 10.8 |

The above results indicate that, in certain embodiments of this invention, an increase in the time of exposure to the etching solvent, H$_2$SO$_4$, results in an increase in adhesion.

EXAMPLE 8

Samples 44–47 were also subjected to the above-listed process sequence, except that the KOH concentration of step F was varied as shown in Table VIII. Furthermore, 2M hydroxylamine hydrochloride was dissolved in the solution of step H (rather than 1M). The following results were obtained:

TABLE VIII

Variation of KOH Concentration

| Sample No. | KOH Concentration (M) | Adhesion value Average (lbs/in) |
|---|---|---|
| 44 | 0.0 | 0.5 |
| 45 | 0.5 | 2.6 |
| 46 | 1.0 | 10.1 |
| 47 | 2.0 | 10.0 |

The above results demonstrate that in certain embodiments of the present invention, higher levels of KOH during pretreatment increase adhesion.

EXAMPLE 9

Samples 48–51 were subjected to the above-listed process sequence, except that a 1M KOH in methanol solution was utilized for steps F and J. Also, 2M hydroxylamine hydrochloride was employed in step H. The immersion time of the polyimide substrate in the KOH/methanol solution of step F was varied as shown in Table IX. The following results were obtained:

TABLE IX

Variation of KOH Immersion Time

| Sample No. | Immersion Time (Minutes) | Adhesion value Average (lbs/in) |
|---|---|---|
| 48 | 0 | 0.7 |
| 49 | 2 | 5.6 |
| 50 | 5 | 7.3 |
| 51 | 10 | 7.0 |

The above results indicate that immersion in KOH for longer periods of time generally increases adhesion in certain embodiments of the present invention.

EXAMPLE 10

Samples 52–55 were subjected to the process sequence listed above, except that 1M KOH was used in steps F and J. Furthermore, a 50/50 solution of methanol and pyridine was utilized in step H, rather than methanol/DMF. The time of immersion of the polyimide substrate in step H was varied, and the following results were obtained:

TABLE X

Variation of Treatment Time (Step H)

| Sample No. | Immersion Time (Minutes) | Adhesion Value Average (lbs/in) |
|---|---|---|
| 52 | 5 | 2.7 |
| 53 | 10 | 5.3 |
| 54 | 20 | 7.1 |
| 55 | 30 | 9.9 |

The above results demonstrate that an increase in the time in which the polyimide surface is exposed to hydroxylamine hydrochloride generally results in an increase in adhesion. However, there may be a maximum treatment time above which no further increase is seen in adhesion, as shown in Table II above.

EXAMPLE 11

The process sequence listed above was also used in this example, except that 1M KOH was employed in steps F and J. The amount of DMF relative to methanol in step H was varied as shown below in Table XI. The following results were obtained:

TABLE XI

Variation of DMF Level

| Sample No. | % DMF (Step H) | Adhesion Value Average (lbs/in) |
|---|---|---|
| 56 | 0 | 5.5 |
| 57 | 25 | 6.1 |
| 58 | 50 | 8.3 |
| 59 | 75 | 8.4 |

The data in Table XI indicates that increasing the amount of DMF relative to methanol increases adhesion of the subsequently applied metal to the substrate in this embodiment of the present invention.

EXAMPLE 12

Samples 60–65 were subjected to the process sequence listed above. However, the DMF of step H was replaced by the compounds listed in Table XII for all but Sample 63. The following results were obtained:

TABLE XII

Variation of the Etching Solvent

| Sample No. | Compound (mixed with methanol) | Adhesion value Average (lbs/in) |
|---|---|---|
| 60 | Pyridine | 7.9 |
| 61 | Methylene chloride | 7.3 |
| 62 | Tetrahydrofuran | 7.9 |
| 63 | DMF | 10.8 |
| 64 | Dichlorobenzene | 1.7 |
| 65 | N—methylpyrrolidine | 0.4 |

The above results indicate that pyridine, methylene chloride, tetrahydrofuran, and DMF were excellent etching compounds which helped to improve overall adhesion of the metal to the polyimide, whereas dichlorobenzene and N-methylpyrrolidine appeared to decrease adhesion, possibly due to the fact that they did not remove the white layer of material which formed on the polyimide surface after step C.

It will be further understood that the foregoing examples are illustrative only, and that variations and modifications may be made without departing from the scope of this invention. For example, the various rinsing, drying and cleaning steps set forth in the above examples may be adjusted and sometimes omitted by those skilled in the art, depending on the condition of the substrate surface and on the other process parameters discussed above.

What is claimed is:

1. A method for improving the adhesion of an applied metal layer to a polyimide surface which comprises treatment of the polyimide surface with an adhesion-promoting compound characterized by the presence of an >NO— moiety.

2. The method of claim 1 wherein the adhesion-promoting compound is characterized by a structure selected from the group consisting of

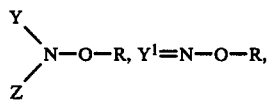

and salts or hydrates threof;
wherein R is selected from the group consisting of hydrogen; alkyl groups containing about 1 to about 10 carbon atoms; aromatic groups containing about 1 to about 20 carbon atoms; sulfonic groups; acyl groups; and amide groups;
wherein Y and Z are individually selected from the group consisting of hydrogen; alkyl groups having about 1 to about 20 carbon atoms; aromatic groups containing about 1 to about 20 carbon atoms; acyl groups; and amide groups;
or Y and Z together form at least one heterocyclic carbon-containing ring with said nitrogen;
or Z and R together form at least one heterocyclic carbon-containing ring with said moiety; and
wherein $Y^1$ is selected from the group consisting of alkylidene groups having about 1 to about 20 carbon atoms and cycloalkylidene groups containing about 1 to about 20 carbon atoms.

3. The method of claim 2 wherein the metal is copper.

4. The method of claim 2 wherein the adhesion promoting compound is selected from the group consisting of O,N-dimethylhydroxylamine hydrochloride, acetone oxime, 2-pyridine aldoxime, N-hydroxyphthalimide, and 1-hydroxybenzotriazole.H$_2$O.

5. The method of claim 2 wherein the adhesion-promoting compound is selected from the group consisting of hydroxylamine and salts of hydroxylamine.

6. The method of claim 2 wherein the polyimide contains a filler.

7. The method of claim 6 wherein the filler is selected from the group consisting of silica, glass, and mica.

8. The method of claim 1 in which the adhesion-promoting compound is incorporated into a non-aggressive liquid which does not discolor, weaken, or cause other deleterious effects to the bulk of the polyimide substrate, the concentration of said compound being in the range of from 0.5 M to about 4.0M.

9. The method of claim 8 wherein the polyimide surface is immersed in the non-aggressive liquid for about 10 minutes to about 60 minutes.

10. The method of claim 9 wherein the liquid is selected from the group consisting of water; mixtures of methanol and pyridine; mixtures of methanol and methylene chloride; and mixtures of methanol and dimethylformamide.

11. The method according to claim 10 wherein the liquid comprises from about 5 to about 95 volume percent pyridine, methylene chloride or dimethylformamide, the balance being methanol.

12. The method of claim 11 wherein the liquid comprises from about 5 to about 50 volume percent dimethylformamide, the balance being methanol.

13. The method of claim 1 wherein the polyimide surface is pretreated prior to treatment with the adhesion promoting compound, said pretreatment comprising the steps of
(a) treating the surface with an etching compound for the polyimide;
(b) treating the surface with a basic solution; and
(c) treating the surface with a solution comprising an alcohol and an etching compound for the polyimide.

14. The method of claim 13 wherein the polyimide contains a filler.

15. The method of claim 13 wherein the etching compound of step (a) is selected from the group consisting of sulfuric acid and dimethylformamide.

16. The method of claim 15 wherein the basic solution of step (b) comprises a compound selected from the group consisting of sodium hydroxide, potassium hydroxide, tetramethylammonium hydroxide, and mixtures thereof, each of which may be dissolved in a solvent selected from the group consisting of water, methanol, ethanol, and mixtures thereof.

17. The method of claim 13 wherein the metal is copper.

18. In a method for the plating of metal on the surface of a polyimide substrate, the improvement which comprises treatment of the surface with an adhesion-promoting compound containing therein an >NO— moiety prior to application of the metal layer by electroless deposition, said deposition followed by electroplating of more of the metal on the electroless-plated surface.

19. The method of claim 18 in which the adhesion-promoting compound is incorporated into a non-aggressive liquid which does not discolor, weaken, or cause other deleterious effects to the bulk of the polyimide substrate.

20. The method of claim 19 wherein the liquid is selected from the group consisting of water; mixtures of methanol and pyridine; mixtures of methanol and methylene chloride; and mixtures of methanol and dimethylformamide.

21. The method of claim 20 wherein the metal is copper.

22. The method of claim 18 wherein the polyimide surface having the electrolessly-deposited metal layer thereon is heat-treated at a temperature of from about 60° C. to about 170° C. for about 5 minutes to about 120 minutes, prior to the electroplating of more of the metal.

23. The method of claim 22 wherein the polyimide surface is heat-treated after the electroplating of more of the metal, at a temperature of from about 80° C. to about 120° C. for about 12 hours to about 20 hours.

24. The method of claim 18 wherein the polyimide surface is heat-treated after the electroplating of more of the metal, at a temperature of from about 80° C. to about 120° C. for about 12 hours to about 20 hours.

* * * * *